United States Patent
Lee et al.

(10) Patent No.: US 10,266,941 B2
(45) Date of Patent: Apr. 23, 2019

(54) MONOMER VAPORIZING DEVICE AND METHOD OF CONTROLLING THE SAME

(71) Applicant: Samsung Display Co., Ltd., Yongin-si, Gyeonggi-do (KR)

(72) Inventors: Yong-Suk Lee, Yongin-si (KR); Myung-Soo Huh, Yongin-si (KR); Suk-Won Jung, Yongin-si (KR); Jeong-Ho Yi, Yongin-si (KR); Mi-Ra An, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 96 days.

(21) Appl. No.: 15/261,629

(22) Filed: Sep. 9, 2016

(65) Prior Publication Data

US 2016/0376698 A1    Dec. 29, 2016

Related U.S. Application Data

(62) Division of application No. 14/010,769, filed on Aug. 27, 2013.

(30) Foreign Application Priority Data

Dec. 6, 2012    (KR) .......................... 10-2012-0141154

(51) Int. Cl.
    *C23C 16/00*    (2006.01)
    *C23C 14/54*    (2006.01)
    (Continued)

(52) U.S. Cl.
    CPC ............ *C23C 14/543* (2013.01); *C23C 14/12* (2013.01); *C23C 14/246* (2013.01);
    (Continued)

(58) Field of Classification Search
    CPC ..... C23C 14/543; C23C 14/12; C23C 14/246; C23C 14/544; C23C 16/4481
    See application file for complete search history.

(56) References Cited

U.S. PATENT DOCUMENTS

| 4,393,013 A | 7/1983 | McMenamin |
| 4,432,828 A | 2/1984 | Siempelkamp et al. |

(Continued)

FOREIGN PATENT DOCUMENTS

| JP | 2008144276 A | 6/2008 |
| JP | 2011068920 A | 4/2011 |

(Continued)

OTHER PUBLICATIONS

Korean Office Action issued by KIPO dated Jun. 20, 2014 corresponding to KR 10-2012-0141154 and Request for Entry of the Accompanying Office Action attached herewith.

(Continued)

*Primary Examiner* — Kelly M Gambetta
(74) *Attorney, Agent, or Firm* — H.C. Park & Associates, PLC

(57) ABSTRACT

A monomer vaporizing device and a method of controlling the same are disclosed. The monomer vaporizing device includes: a first vaporizer and a second vaporizer that receive a purge gas and vaporize a first monomer and a second monomer, respectively; a first flow pipe and a second flow pipe that are connected to the respective vaporizers and allow the first monomer and the second monomer, vaporized by the respective vaporizers, to flow therethrough; a transition tube that is connected to the first flow pipe and the second flow pipe and supplies at least one of the first monomer and the second monomer to a deposition chamber; and a control valve apparatus that regulates monomer flow into the deposition chamber. The device facilitates smooth (Continued)

and uninterrupted application of monomer to the interior of a deposition chamber.

3 Claims, 5 Drawing Sheets

(51) Int. Cl.
    *C23C 14/24*     (2006.01)
    *C23C 16/448*     (2006.01)
    *C23C 14/12*     (2006.01)
    *B05D 1/00*     (2006.01)

(52) U.S. Cl.
    CPC ........ *C23C 14/544* (2013.01); *C23C 16/4481* (2013.01); *B05D 1/60* (2013.01)

(56) References Cited

U.S. PATENT DOCUMENTS

| | | | |
|---|---|---|---|
| 4,473,596 A | 9/1984 | Beerwald et al. | |
| 5,098,741 A | 3/1992 | Nolet et al. | |
| 5,330,847 A | 7/1994 | Murphy et al. | |
| 6,132,515 A | 10/2000 | Gauthier | |
| 6,663,713 B1 | 12/2003 | Robles et al. | |
| 2006/0130744 A1 | 6/2006 | Clark | |
| 2007/0248515 A1 | 10/2007 | Tompa et al. | |
| 2008/0050510 A1* | 2/2008 | Stevens | C23C 16/4482 427/8 |
| 2008/0138517 A1 | 6/2008 | Ahn et al. | |
| 2009/0266296 A1 | 10/2009 | Tachibana et al. | |
| 2010/0255198 A1 | 10/2010 | Cleary et al. | |
| 2011/0079179 A1 | 4/2011 | Okura | |
| 2011/0193993 A1 | 8/2011 | Yeom et al. | |
| 2012/0180719 A1* | 7/2012 | Inoue | C23C 16/4481 118/708 |
| 2013/0011804 A1 | 1/2013 | Seo et al. | |
| 2013/0203267 A1* | 8/2013 | Pomarede | H01L 21/02148 438/778 |

FOREIGN PATENT DOCUMENTS

| | | |
|---|---|---|
| KR | 1019990086150 A | 12/1999 |
| KR | 1020080044905 A | 5/2008 |
| KR | 10-2008-0106294 A | 12/2008 |
| KR | 10-2009-0121159 A | 11/2009 |
| KR | 10-2011-0078959 A | 7/2011 |
| KR | 10-2011-0092481 A | 8/2011 |
| KR | 10-2011-0110749 A | 10/2011 |
| KR | 10-2012-0030796 A | 3/2012 |
| WO | 2012/039522 A1 | 3/2012 |

OTHER PUBLICATIONS

Korean Office Action issued by KIPO dated Dec. 23, 2014 in connection to corresponding Korean Application No. 10-2012-0141154 and Request for Entry of the Accompanying Office Action attached herewith.

* cited by examiner

MONOMER VAPORIZING DEVICE AND METHOD OF CONTROLLING THE SAME

CLAIM OF PRIORITY

This application is filed pursuant to 35 U.S.C. § 121 as a Divisional Application of Applicant's patent application Ser. No. 14/010,769 filed in the U.S. Patent & Trademark Office on 27 Aug. 2013, makes reference to, incorporates the same herein, and claims all benefits accruing under 35 U.S.C. § 120 from an application for MONOMER VAPORIZING DEVICE AND METHOD OF CONTROLLING THE SAME earlier filed in the Korean intellectual Property Office on 6 Dec. 2012 and there duly assigned Serial No. 10-2012-0141154.

BACKGROUND OF THE INVENTION

Field of the Invention

The present invention relates to a device and a method, and, more particularly, to a monomer vaporizing device and a method of controlling the same.

Description of the Related Art

Portable electronic devices are widely used. Recently, not only small devices such as mobile phones but also tablet PCs have become widely used as portable electronic devices.

In order to support various functions, a portable electronic device includes a display unit for providing visual information such as an image to a user. Recently, as other device components for driving the display unit have become smaller, the percentage of the device volume that is occupied by the display unit in the portable electronic device has increased. Taking advantage of these advances, a display unit which may be bent at a predetermined angle has been developed.

In this case, a lifetime of the display unit may be extended by forming an encapsulation layer and separating the display unit from the external environment. In detail, the encapsulation layer may be formed as a multi-layer thin film by coating an organic layer (referred to as a monomer layer) and an inorganic layer. In particular, the monomer layer may be formed on a top surface of the display unit by spraying a vaporized monomer onto the display unit in a deposition chamber by using a monomer vaporizing device.

SUMMARY OF THE INVENTION

The present invention provides a monomer vaporizing device which may smoothly supply a monomer to a display surface to be coated and a method of controlling the monomer vaporizing device.

According to an embodiment of the present invention, there is provided a monomer vaporizing device including: a first vaporizer that receives a purge gas and vaporizes a first monomer; a second vaporizer that is disposed parallel to the first vaporizer, receives the purge gas, and vaporizes a second monomer; a first flow pipe that is connected to the first vaporizer and allows the first monomer vaporized by the first vaporizer to flow therethrough; a second flow pipe that is connected to the second vaporizer and allows the second monomer vaporized by the second vaporizer to flow therethrough; a transition tube that is connected to the first flow pipe and the second flow pipe and supplies at least one of the first monomer and the second monomer to a deposition chamber; and a control valve that is provided on at least one of the first flow pipe and the second flow pipe and adjusts an opening degree of at least one of the first flow pipe and the second flow pipe.

The control valve may include a three way valve that is provided at a position where the first flow pipe, the second flow pipe, and the transition tube meet.

The control valve may include: a first control valve that is provided on the first flow pipe and adjusts an opening degree of the first flow pipe; and a second control device that is provided on the second flow pipe and adjusts an opening degree of the second flow pipe.

The monomer vaporizing device may further include: a first sensor unit that is provided on the first vaporizer and measures at least one of a pressure and a temperature of the first vaporizer; and a second sensor unit that is provided on the second vaporizer and measures at least one of a pressure and a temperature of the second vaporizer.

The monomer vaporizing device may further include a control unit that controls an opening degree of the control valve based on at least one of the pressure and the temperature measured by each of the first sensor unit and the second sensor unit.

When it is determined that the pressure of the first vaporizer as measured by the first sensor unit exceeds a preset first set pressure range, the control unit may direct the control valve to close the first flow pipe and open the second flow pipe.

When it is determined that the pressure of the second vaporizer as measured by the second sensor unit exceeds a second set pressure range which is preset, the control unit may direct the control valve to close the second flow pipe.

When the pressure of the first vaporizer does not reach a first set pressure range for a first set time, the control unit may direct the control valve to close the first flow pipe and open the second flow pipe.

When the pressure of the second vaporizer does not reach a second set pressure range for a second set time, the control unit may direct the control valve to close the second flow pipe.

When it is determined that the temperature of the first vaporizer as measured by the first sensor unit exceeds a first set temperature range which is preset, the control unit may direct the control valve to close the first flow pipe and open the second flow pipe.

When it is determined that the temperature of the second vaporizer as measured by the second sensor unit exceeds a second set temperature range which is preset, the control unit may direct the control valve to close the second flow pipe.

When the temperature of the first vaporizer does not reach a first set temperature range for a third set time, the control unit may direct the control valve to close the first flow pipe and open the second flow pipe.

When the temperature of the second vaporizer does not reach a second set temperature range for a fourth set time, the control unit may direct the control valve to close the second flow pipe.

The monomer vaporizing device may further include an alarm unit that alarms an external user when at least one of the pressure and the temperature measured by each of the first sensor unit and the second sensor unit does not correspond to at least one of a set pressure range and a set temperature range which are preset.

The monomer vaporizing device may further include a monomer supply unit that supplies at least one of the first monomer and the second monomer to at least one of the first vaporizer and the second vaporizer.

The monomer supply unit may include: a monomer storage unit that stores at least one of the first monomer and the second monomer; and a monomer supply pipe that connects the monomer storage unit to at least one of the first vaporizer and the second vaporizer, and allows at least one of the first monomer and the second monomer to flow therethrough.

According to another embodiment of the present invention, there is provided a method of controlling a monomer vaporizing device, the method including: supplying a monomer to at least one of a first vaporizer and a second vaporizer, vaporizing the monomer by heating at least one of the first vaporizer and the second vaporizer; measuring at least one of a temperature and a pressure of the first vaporizer while first supplying the monomer vaporized by the first vaporizer to a deposition chamber; and blocking the exit of the monomer from the first vaporizer based on at least one of the measured temperature and the measured pressure of the first vaporizer, and, if the exit of the monomer from the first vaporizer is blocked, supplying the monomer vaporized by the second vaporizer to the deposition chamber.

The blocking of the monomer supplied by the first vaporizer may include blocking the monomer supplied by the first vaporizer when the pressure of the first vaporizer exceeds a first set pressure range which is preset.

The supplying of the monomer vaporized by the second vaporizer to the deposition chamber may include supplying the monomer vaporized by the second vaporizer to the deposition chamber when the pressure of the second vaporizer corresponds to a second set pressure range which is preset.

The blocking of the monomer supplied by the first vaporizer may include blocking the monomer supplied by the first vaporizer when the pressure of the first vaporizer does not reach a first set pressure range within a first set time.

The method may further include blocking the monomer supplied by the second vaporizer to the deposition chamber when the pressure of the second vaporizer does not reach a second set pressure range within a second set time.

The blocking of the monomer supplied by the first vaporizer may include blocking the monomer supplied by the first vaporizer when the temperature of the first vaporizer does not reach a first set temperature range within a third set time.

The monomer supplied by the second vaporizer to the deposition chamber may be blocked when the temperature of the second vaporizer does not reach a second set temperature range within a fourth set time.

The blocking of the monomer supplied by the first vaporizer may include blocking the monomer supplied by the first vaporizer when the temperature of the first vaporizer exceeds a first set temperature range which is preset.

The monomer supplied by the second vaporizer to the deposition chamber may be blocked when the temperature of the second vaporizer exceeds a second set temperature range which is preset.

BRIEF DESCRIPTION OF THE DRAWINGS

The above and other features and advantages of the present invention will be made more apparent by describing in detail exemplary embodiments thereof with reference to the attached drawings in which.

DETAILED DESCRIPTION OF THE INVENTION

As used herein, the term "and/or" includes any and all combinations of one or more of the associated listed items. Expressions such as "at least one of," when preceding a list of elements, modify the entire list of elements and do not modify the individual elements of the list.

The present invention will now be described more fully with reference to the accompanying drawings, in which exemplary embodiments of the invention are shown. The invention may, however, be embodied in many different forms and should not be construed as being limited to the embodiments set forth herein; rather these embodiments are provided so that this disclosure will be thorough and complete, and will fully convey the concept of the invention to one of ordinary skill in the art. Meanwhile, the terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof. It will be understood that, although the terms first, second, etc. may be used herein to describe various elements, these elements should not be limited by these terms. These terms are only used to distinguish one element from another.

A first monomer and a second monomer used herein may be the same material. For convenience of explanation, however, a monomer introduced into a first vaporizer 120 will be referred to as a first monomer and a monomer introduced into a second vaporizer 130 will be referred to as a second monomer.

Figure 1:
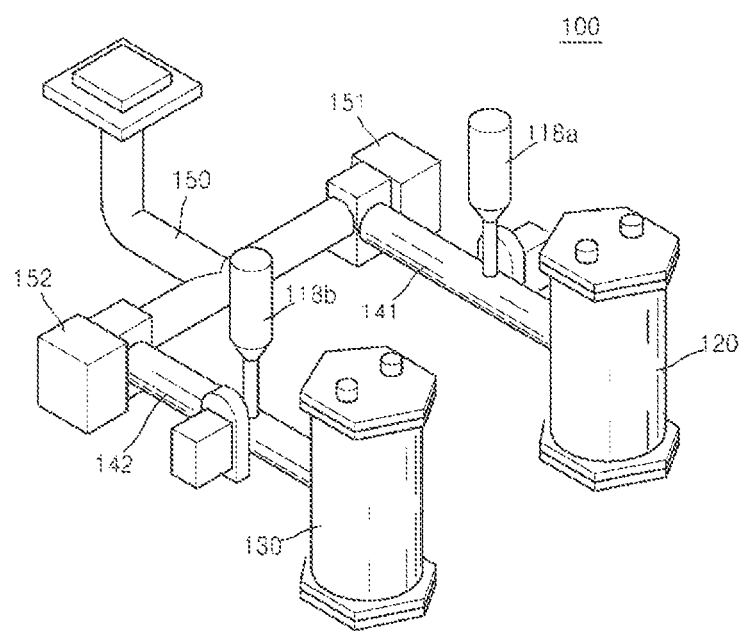
FIG. 1 is a perspective view illustrating a monomer vaporizing device according to an embodiment of the present invention.
Figure 2:
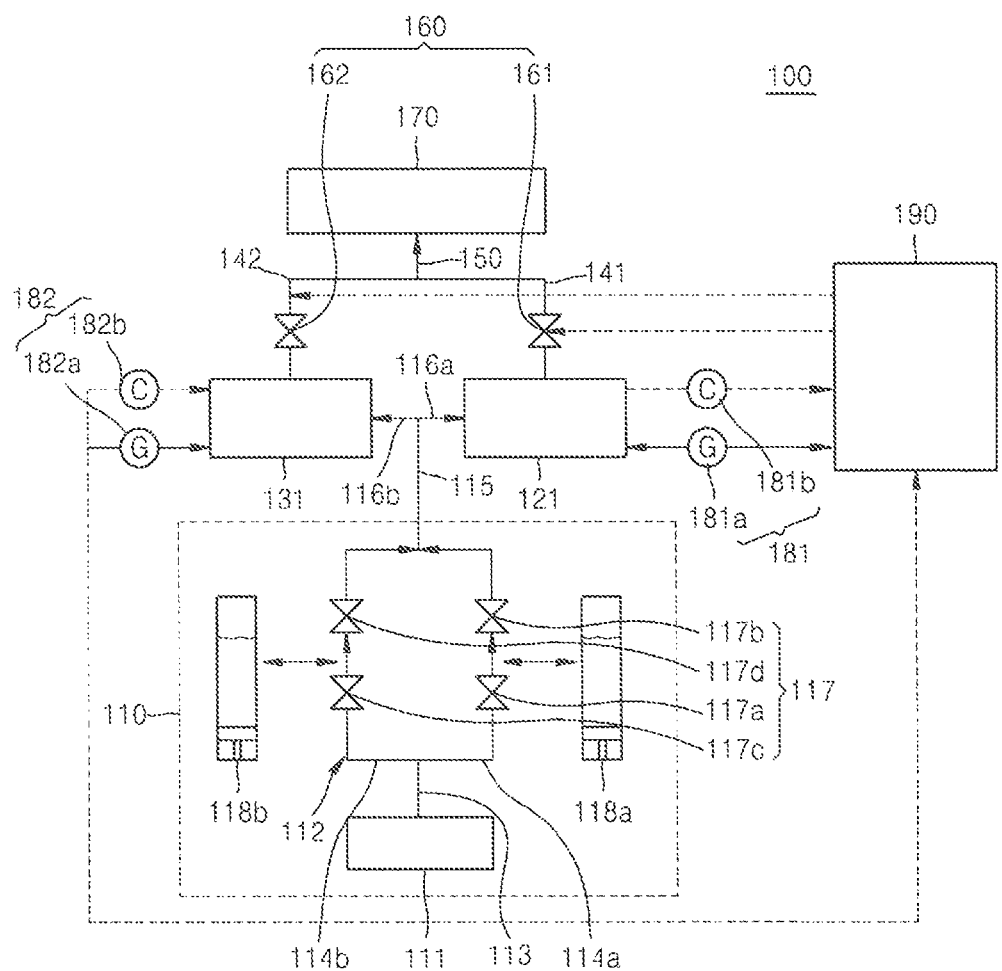
FIG. 2 is a block diagram illustrating the monomer vaporizing device of FIG. 1.

FIG. 1 is a perspective view illustrating a monomer vaporizing device 100 according to an embodiment of the present invention. FIG. 2 is a block diagram illustrating the monomer vaporizing device 100 of FIG. 1.

Referring to FIGS. 1 and 2, the monomer vaporizing device 100 may include a monomer supply unit 110 that stores at least one of the first monomer and the second monomer and supplies the stored monomer to at least one of the first vaporizer 120 and the second vaporizer 130. In this case, the monomer supply unit 110 may include a monomer storage unit 111 that stores at least one of the first monomer and the second monomer. The monomer storage unit 111 may store at least one of the first monomer and the second monomer in a liquid state.

Also, the monomer supply unit 110 may include a monomer supply pipe 112 that connects the monomer storage unit 111 to at least one of the first vaporizer 120 and the second vaporizer 130 and allows at least one of the first monomer and the second monomer to flow therethrough. In this case, the monomer supply pipe 112 may include a first connection pipe 113 that is connected to the monomer storage unit 111 and allows at least one of the first monomer and the second monomer to flow therethrough. Also, the monomer supply pipe 112 may include a first branch pipe 114a that branches from the first connection pipe 113. The monomer supply pipe 112 may include a second branch pipe 114b that branches from the first connection pipe 113 and is spaced apart by a certain interval from the first branch pipe 114a.

The monomer supply pipe 112 may include a second connection pipe 115 to which the first branch pipe 114a and the second branch pipe 114b gather and through which at least one of the first monomer and the second monomer flows. Also, the monomer supply pipe 112 may include a first supply pipe 116a that branches from the second connection pipe 115 and is connected to the first vaporizer 120, and a second supply pipe 116b that branches from the second connection pipe 115 and is connected to the second vaporizer 130.

The monomer supply unit 110 may include an opening/closing valve 117 that is provided on the monomer supply pipe 112 and opens/closes the monomer supply pipe 112. In this case, a plurality of the opening/closing valves 117 may be provided. The plurality of opening/closing valves 117 may be disposed on the first branch pipe 114a and the second branch pipe 114b to be spaced apart by a certain interval from each other.

In detail, the plurality of opening/closing valves 117 may include a first opening/closing valve 117a and a second opening/closing valve 117b provided on the first branch pipe 114a, and a third opening/closing valve 117c and a fourth opening/closing valve 117d provided on the second branch pipe 114b. In this case, the first opening/closing valve 117a and the second opening/closing valve 117b may open or close the first branch pipe 114a. Also, the third opening/closing valve 117c and the fourth opening/closing valve 117d may open or close the second branch pipe 114b. In particular, the first opening/closing valve 117a through the fourth opening/closing valve 117d may be electromagnetic valves that are opened/closed according to an electromagnetic signal. However, the present embodiment is not limited thereto, and the first opening/closing valve 117a through the fourth opening/closing valve 117d may be any of various types of valves as long as they may open/close the first branch pipe 114a and the second branch pipe 114b.

The monomer supply unit 110 may include an actuator (not shown) that is provided on the monomer supply pipe 112 and causes the first monomer or the second monomer to flow. In particular, the actuator may include a first actuator 118a that is provided on the first branch pipe 114a and a second actuator 118b that is provided on the second branch pipe 114b. In this case, the first actuator 118a and the second actuator 118b may be formed as syringe pumps.

The first actuator 118a may be connected to the first branch pipe 14a between the first opening/closing valve 117a and the second opening/closing valve 117b. Also, the second actuator 118b may be connected to the second branch pipe 114b between the third opening/closing valve 117c and the fourth opening/closing valve 117d.

The monomer vaporizing device 100 may include the first vaporizer 120, which functions to receive a purge gas and vaporize the first monomer. In this case, the first vaporizer may be connected to the monomer supply pipe 112 as described above. In particular, the first vaporizer 120 may be connected to the first supply pipe 116a and may receive the first monomer.

The first vaporizer 120 may include a first barrel 121, into which the first monomer has been sprayed via a nozzle and in which the first monomer is stored. Also, the first vaporizer 120 may include a first temperature control unit (not shown) that is provided on the first barrel 121 and heats or cools an inside of the first barrel 121. In this case, the first barrel 121 and the first temperature control unit are similar to those used in monomer vaporizers generally known in the art, and thus a detailed explanation thereof will not be given.

The monomer vaporizing device 100 may include a second vaporizer 130 that is disposed parallel to the first vaporizer 120. In this case, the second vaporizer 130 may include a second barrel 131 and a second temperature control unit (not shown), like the first vaporizer 120.

Also, the second vaporizer 130 may be connected to the second supply pipe 116b and may vaporize the second monomer supplied from the second supply pipe 116b. In this case, the second vaporizer 130 may receive an external purge gas and may vaporize the second monomer.

The monomer vaporizing device 100 may include a first flow pipe 141 that is connected to the first vaporizer 120 and allows the first monomer, vaporized by the first vaporizer 120, to flow therethrough. Also, the monomer vaporizing device 100 may include a second flow pipe 142 that is spaced apart by a certain interval from the first flow pipe 141, is connected to the second vaporizer 130, and allows the second monomer, vaporized by the second vaporizer 130, to flow therethrough.

The monomer vaporizing device 100 may include a transition tube 150 that is connected to the first flow pipe 141 and the second flow pipe 142, and is also connected to a deposition chamber 170. In this case, the transition tube 150 may supply at least one of the first monomer and the second monomer to the deposition chamber 170.

Also, the monomer vaporizing device 100 may include a control valve 160 that is provided on at least one of the first flow pipe 141 and the second flow pipe 142. In this case, the control valve 160 may adjust an opening degree of at least one of the first flow pipe 141 and the second flow pipe 142. In particular, the control valve 160 may be provided at any of various positions. In detail, the control valve 160 may be provided at a position where the first flow pipe 141, the second flow pipe 142, and the transition tube 150 meet. In this case, the control valve may include a three-way valve provided at the position where the first flow pipe 141, the second flow pipe 142, and the transition tube 150 meet.

Also, the control valve 160 may be provided on each of the first flow pipe 141 and the second flow pipe 142. In this case, the control valve 160 may include a first control valve 161 that is provided on the first flow pipe 141, and a second control valve 162 that is provided on the second flow pipe 142.

For convenience, the following explanation will be made in detail on the assumption that the control valve 160 includes the first control valve 161 and the second control valve 162.

The monomer vaporizing device 100 may include a first sensor unit 181 that is provided on the first vaporizer 120 and measures at least one of a pressure and a temperature of the first vaporizer 120. Also, the monomer vaporizing device 100 may include a second sensor unit 182 that is provided on the second vaporizer 130 and measures at least one of a pressure and a temperature of the second vaporizer 130.

In this case, the first sensor unit 181 may include a first pressure measuring sensor unit 181a that measures a pressure in the first vaporizer 120. In particular, the first sensor unit 181 may further include a first temperature measuring sensor unit 181b that measures a temperature in the first vaporizer 120 or a temperature of the first temperature control unit.

The second sensor unit 182 may include a second pressure measuring sensor unit 182a and a second temperature measuring sensor unit 182b, like the first sensor unit 181. In this case, the second pressure measuring sensor unit 182a and the second temperature measuring sensor unit 182b are the same as the first pressure measuring sensor unit 181a and the first temperature measuring sensor unit 181b in terms of structure and function, and thus a detailed explanation thereof will not be given.

The monomer vaporizing device 100 may include a control unit 190 that controls an opening degree of the control valve 160 based on at least one of the pressure and the temperature measured by the first sensor unit 181 and the second sensor unit 182. In this case, examples of the control unit 190 may include an external personal computer or a portable electronic device, and the control unit 190 may include a circuit board provided therein.

The control unit 190 may control the first control valve 161 based on at least one of the pressure and the temperature of the first vaporizer 120 as measured by the first sensor unit 181. Also, the control unit 190 may control the second control valve 162 based on at least one of the pressure and the temperature of the second vaporizer 130 as measured by the second sensor unit 182. A control method of the control unit 190 will be explained below in detail.

The monomer vaporizing device 100 may include an alarm unit (not shown) that alarms an external user that the first vaporizer 120 and the second vaporizer 130 malfunction. In this case, the alarm unit may be any of various types of devices. For example, the alarm unit may include an audio unit that outputs an alarming sound, or may include a display unit that outputs an alarming text or image. For convenience, the following explanation will be made on the assumption that the alarming unit includes an audio unit.

A method of controlling the monomer vaporizing device 100 will now be explained in detail.

Figure 3:
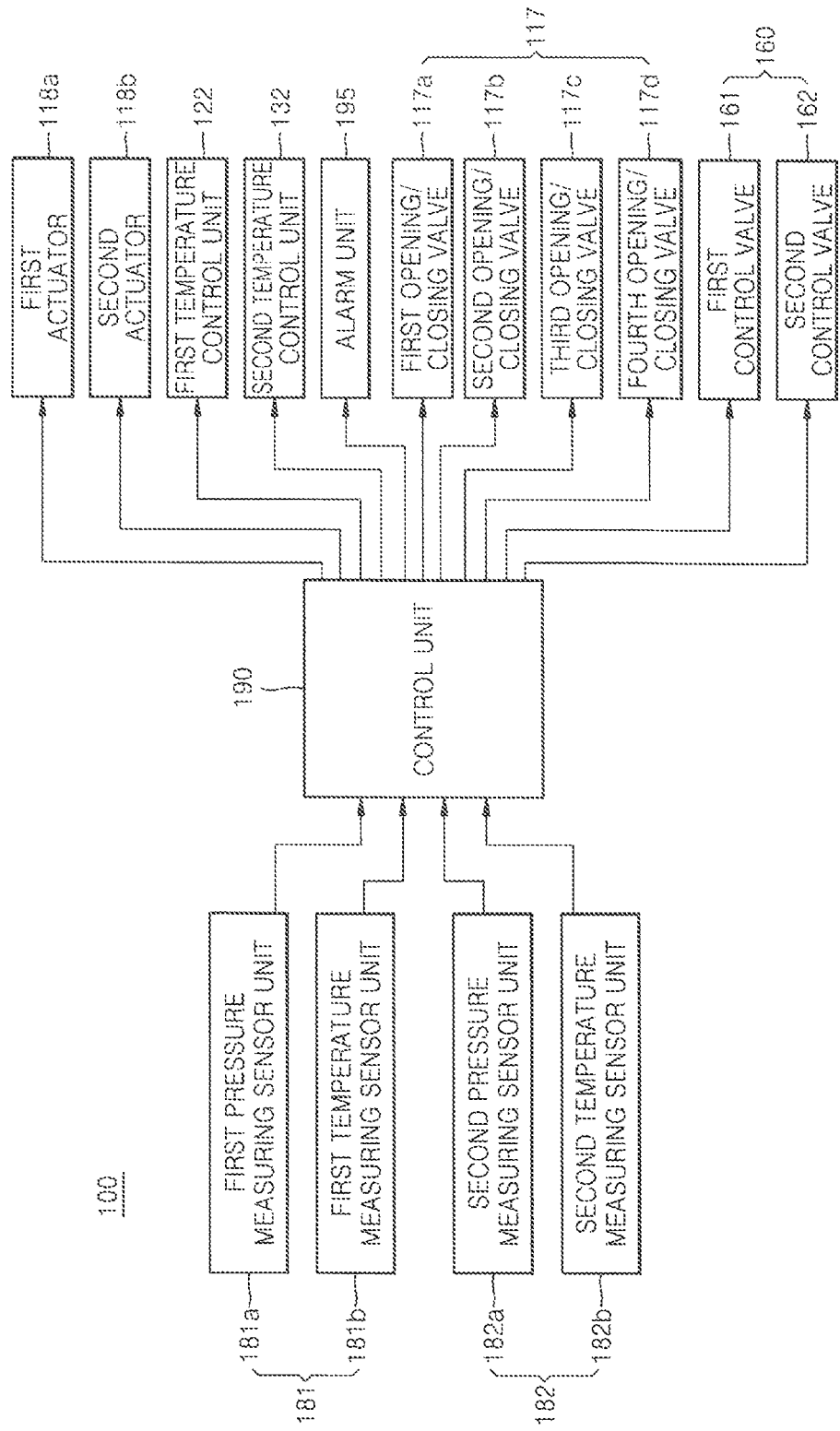
FIG. 3 is a block diagram illustrating a control flow of the monomer vaporizing device of FIG. 1.
Figure 4:
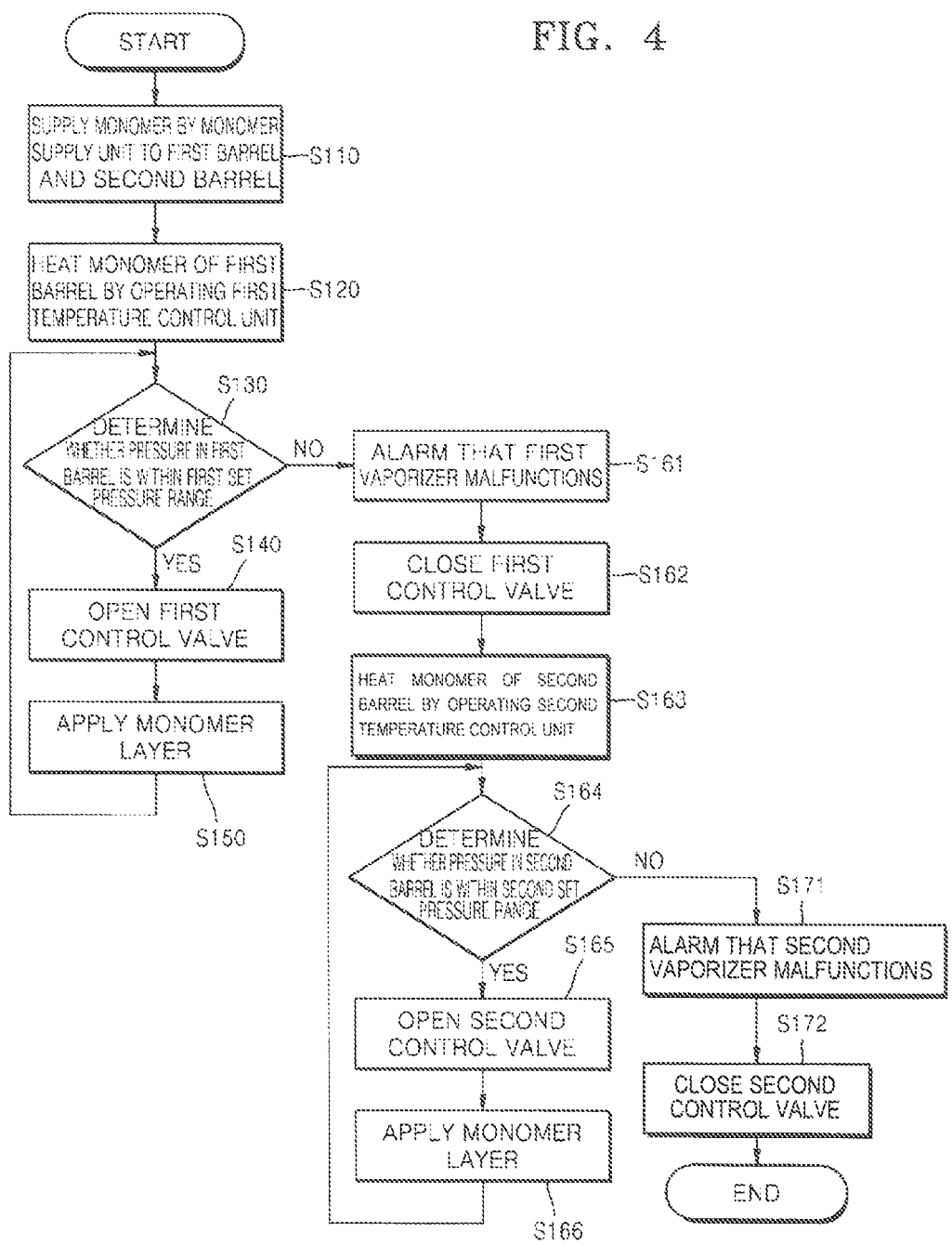
FIG. 4 is a flowchart illustrating a method of controlling the monomer vaporizing device of FIG. 1, according to an embodiment of the present invention.

FIG. 3 is a block diagram illustrating a control flow of the monomer vaporizing device 100 of FIG. 1. FIG. 4 is a flowchart illustrating a method of controlling the monomer vaporizing device 100 of FIG. 1, according to an embodiment of the present invention. The same reference numerals denote the same elements.

Referring to FIGS. 3 and 4, the monomer vaporizing device 100 is a device for vaporizing a monomer and supplying the monomer to a display panel when a monomer layer constituting an encapsulation layer of the display panel is formed. The display panel may be any of various display panels such as an organic light-emitting display panel, a liquid crystal display panel, and a plasma display panel. However, for convenience, the following explanation will be made on the assumption that the display panel is an organic light-emitting display panel.

Examples of the organic light-emitting display panel may include a top emission organic light-emitting display panel in which at least one internal light-emitting layer emits light toward a top surface and a bottom emission organic light-emitting display panel in which at least one internal light-emitting layer emits light toward a bottom surface. Also, the organic light-emitting display panel may include a separate light-emitting layer, a plurality of light-emitting layers stacked to emit white light, or a color filter or a color conversion layer through which emitted light passes.

Also, in the organic light-emitting display panel, a semiconductor active layer may be formed of polysilicon or an oxide semiconductor. For convenience, the following explanation will be made in detail on the assumption that the display panel is a top emission organic light-emitting display panel including a separate light-emitting layer and a semiconductor active layer formed of polysilicon. In this case, a method of manufacturing the display panel may be a method generally known in the art, and thus a detailed explanation thereof will not be given.

Once the manufactured display panel is prepared, the display panel may be inserted into the deposition chamber 170. After the display panel is inserted into the deposition chamber 170, the monomer vaporizing device 100 may operate.

Once the monomer vaporizing device 100 operates, the first opening/closing valve 117a through the fourth opening/closing valve 117d may be opened to cause the first monomer and the second monomer stored in the monomer storage unit 111 to flow. In this case, the first actuator 118a and the second actuator 118b may operate to cause the first monomer and the second monomer to flow from the monomer storage unit 111 to the monomer supply pipe 112.

t In detail, when the first opening/closing valve 117a and the third opening/closing valve 117c are opened and then the first actuator 118a and the second actuator 118b operate, the first monomer and the second monomer stored in the monomer storage unit 111 may be transferred from the first connection pipe 113 through the first branch pipe 114a and the second branch pipe 114b to the first actuator 18a and the second actuator 118b, respectively. After the first monomer and the second monomer are respectively introduced into the first actuator 118a and the second actuator 118b, the first opening/closing valve 117a and the third opening/closing valve 117c may be closed.

When the process is completed, the second opening/closing valve 117b and the fourth opening/closing valve 117d may be opened and then the first actuator 118a and the second actuator 118b may operate. In this case, the first monomer and the second monomer may flow to the first branch pipe 114a and the second branch pipe 114b.

The first monomer and the second monomer flowing as described above may gather from the first branch pipe 114a and the second branch pipe 114b to the first connection pipe 113 and then may respectively branch to the first supply pipe 116a and the second supply pipe 116b. In this case, the first supply pipe 116a and the second supply pipe 116b may respectively supply the first monomer and the second monomer to the first vaporizer 120 and the second vaporizer 130.

When certain amounts of first monomer and second monomer are respectively supplied to the first vaporizer 120 and the second vaporizer 130 as described above, the second opening/closing valve 117b and the fourth opening/closing valve 117d may operate to close the first branch pipe 114a and the second branch pipe 114b. Accordingly, after the first monomer and the second monomer are respectively supplied to the first vaporizer 120 and the second vaporizer 130, the second opening/closing valve 117b and the fourth opening/closing valve 117d may prevent the first monomer and the second monomer from flowing backward from the first vaporizer 120 and the second vaporizer 130.

Once the first monomer and the second monomer are supplied as described above, the first monomer and the second monomer may be respectively introduced into the first barrel 121 and the second barrel 131. In this case, the first monomer and the second monomer may be sprayed into the first barrel 121 and the second barrel 131 through ultrasonic nozzles.

When the first monomer and the second monomer are respectively sprayed into the first barrel 121 and the second barrel 131 as described above, the first temperature control unit 122 and the second temperature control unit 132 may operate. In this case, the first temperature control unit 122 and the second temperature control unit 132 may operate simultaneously or sequentially. In particular, in one embodiment, the first temperature control unit 122 may first operate, and the second temperature control unit 132 may operate when the control unit 190 determines that the first barrel 121 malfunctions. However, for convenience, the following explanation will be made for the case in which the first temperature control unit 122 and the second control unit 132 operate sequentially.

In detail, the control unit 190 may increase a temperature in the first barrel 121 by causing the first temperature control unit 122 to operate. In this case, the control unit 190 may measure a temperature of the first temperature control unit 122 and may maintain the temperature in the first barrel 121 in a certain range.

When the first temperature control unit 122 operates as described above, the first monomer in the first barrel 121 may be vaporized into a gas. In this case, the first temperature measuring sensor unit 181b provided on the first temperature control unit 122 and the first pressure measuring sensor unit 181a provided on the first barrel 121 may measure a temperature and a pressure of the first vaporizer 120 and transmit the temperature and the pressure to the control unit 190. The following explanation will be made in detail on the assumption that the first control valve 161 is controlled by using the pressure of the first vaporizer 120.

In detail, the pressure in the first barrel 121 measured by the first pressure measuring sensor unit 181a may be transmitted to the control unit 190. In this case, a first set pressure range may be preset in the control unit 190.

When the pressure of the first barrel 121 corresponds to the first set pressure range, the control unit 190 may open the first flow pipe 141 by opening the first control valve 161. That is, when the pressure of the first barrel 121 enters the first set pressure range, the control unit 190 may open the first control valve 161. Also, when the pressure of the first barrel 121 enters the first set pressure range in a first set time, the control unit 190 may open the first control valve 161. In this case, the first monomer of the first vaporizer 120 may move to the deposition chamber 170 and may be deposited on the display panel. In this case, the control unit 190 may close the second control valve 162.

During the process, the first pressure measuring sensor unit 181a may continuously transmit the pressure of the first barrel 121 to the control unit 190. In this case, the control unit 190 may monitor whether the first vaporizer 120 operates within acceptable parameters based on the pressure of the first barrel 121.

When it is determined as a result of the monitoring that the pressure of the first barrel 121 and the first set pressure range do not correspond to each other, the control unit 190 may cause the alarm unit to alarm the external user that the monomer vaporizing device 100 malfunctions. In particular, when the pressure of the first barrel 121 exceeds the first set pressure range, the control unit 190 may operate the alarm unit to alarm the external user.

Whether the monomer vaporizing device 100 malfunctions may be determined by determining whether the pressure of the first barrel 121 corresponds to the first set pressure range as described. Alternatively, whether the monomer vaporizing device 100 malfunctions may be determined by determining whether the pressure of the first barrel 121 remains within the first set pressure range for the first set time.

In detail, the control unit 190 may continuously receive data indicating the pressure of the first barrel 121 from the first pressure measuring sensor unit 181a. In this case, the control unit 190 may determine whether the pressure of the first barrel 121 remains within the first set pressure range for the first set time. In this case, when the pressure of the first barrel 121 moves outside of the first set pressure range in the first set time, the control unit 190 may determine that the monomer vaporizing device 100 malfunctions. In particular, the control unit 190 may determine that the first vaporizer 120 malfunctions when the pressure of the first barrel does not remain within the first set pressure range in the first set time.

Whether the first vaporizer 120 malfunctions may be determined by using two methods, that is, a method of determining whether the pressure exceeds the first set pressure range and a method of determining whether the pressure remains within the first set pressure range for the first set time as described above. However, for convenience, the following explanation will be made on the assumption that whether the first vaporizer 120 malfunctions is determined by determining whether the pressure exceeds the first set pressure range.

When the pressure of the first barrel 121 exceeds the first set pressure range, the control unit 190 may close the first flow pipe 141 by closing the first control valve 161.

When the process is completed, the control unit 190 may cause the second temperature control unit 132 to operate. In this case, the control unit 190 may control the second temperature control unit 132 such that the second monomer of the second barrel 131 has a certain pressure and a certain temperature.

While the second monomer of the second barrel 131 is heated by the second temperature control unit 132, a temperature of the second temperature control unit 132 and a pressure of the second barrel 131 may be respectively measured by the second temperature measuring sensor unit 182b and the second pressure measuring sensor unit 182a.

The measured temperature and the measured pressure may be transmitted to the control unit 190. In particular, the control unit 190 may control the second control valve 162 based on the measured pressure.

In detail, the pressure of the second barrel 131 measured by the second pressure measuring sensor unit 182a may be transmitted to the control unit 190. The control unit 190 may compare the pressure of the second barrel 131 with a preset second set pressure range. In this case, the second set pressure range may be set to be the same as the first set pressure range.

When it is determined that the second set pressure range and the pressure of the second barrel 131 correspond to each other, the control unit 190 may open the second control valve 162 and may supply the second monomer from the second barrel 131 to the deposition chamber 170. In this case, examples of a method of determining whether the pressure of the second barrel 131 corresponds to the second set pressure range which is performed by the control unit 190 may include a method of determining whether the pressure of the second barrel 131 is within the second set pressure range and a method of determining whether the pressure of the second barrel 131 remains within the second set pressure range for a second set time. However, for convenience, the following explanation will focus on the method of determining whether the pressure of the second barrel 131 is within the second set pressure range; this determination is reached by the control unit 190.

The second pressure measuring sensor unit 182a may continuously measure a pressure of the second barrel 131 in a state where the second control valve 162 is opened. The measured pressure of the second barrel 131 may be continuously transmitted to the control unit 190.

The control unit 190 may compare the pressure of the second barrel 131 with the second set pressure range. In this case, when it is determined that the pressure of the second barrel 131 exceeds the second set pressure range, the control unit 190 may alarm the external user by using the alarm unit. Also, the control unit 190 may close the second control valve 162, closing the second flow pipe 142.

In particular, the control unit 190 may direct the second control valve 162 to be closed, and then may direct the monomer vaporizing device 100 to stop operating.

Alternatively, the control unit 190 may determine whether the pressure of the second barrel 131 remains within the second set pressure range for the second set time. In particular, when the pressure of the second barrel 131 does not remain within the second set pressure range for the second set time, the control unit 190 may determine that the second vaporizer 130 malfunctions and may accordingly activate the alarm unit and close the second control valve 162.

Accordingly, when the first vaporizer 120 malfunctions, the monomer vaporizing device 100 may operate the second vaporizer 130 and thus may continuously perform the process of applying a monomer layer to the display panel.

Also, the monomer vaporizing device 100 may prevent further malfunction and rapidly respond to a malfunction identified by determining the pressures of the first vaporizer 120 and the second vaporizer 130 on an ongoing basis as the monomer layer is deposited.

Figure 5:
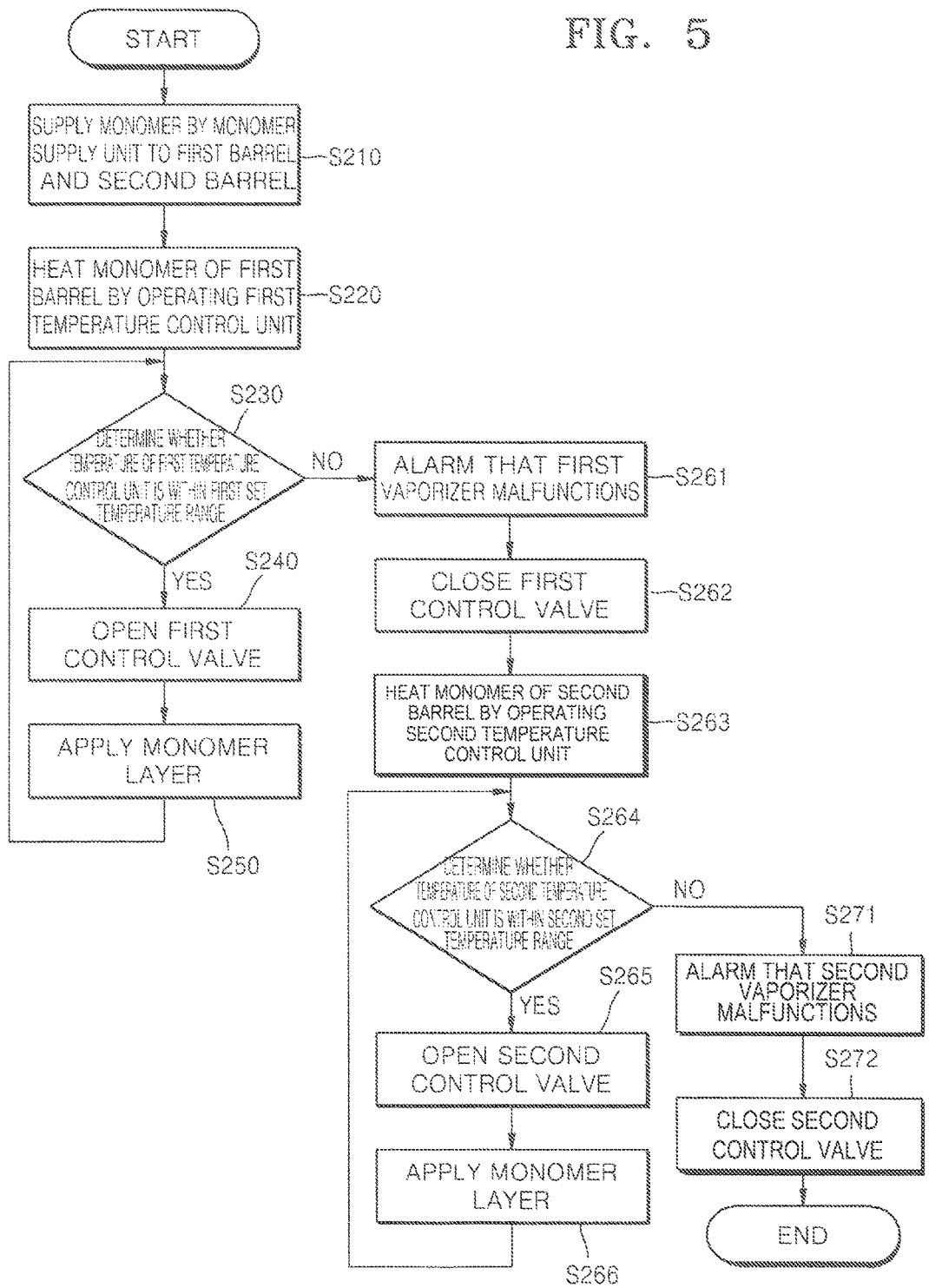
FIG. 5 is a flowchart illustrating a method of controlling the monomer vaporizing device of FIG. 1, according to another embodiment of the present invention.

FIG. 5 is a flowchart illustrating a method of controlling the monomer vaporizing device 100, according to another embodiment of the present invention. The same reference numerals denote the same members.

Referring to FIG. 5, the monomer vaporizing device 100 may be controlled based on at least one of a temperature of the first vaporizer 120 and a temperature of the second vaporizer 130. In detail, the monomer vaporizing device 100 may be controlled based on a temperature of the first temperature control unit 122 and a temperature of the second temperature control unit 132. In this case, a method of controlling the monomer vaporizing device 100 based on at least one of a temperature of the first temperature control unit 122 and a temperature of the second temperature control unit 132 may be similar to the method of controlling the monomer vaporizing device 100 based on at least one of a pressure of the first barrel 121 and a pressure of the second barrel 131 described above.

In detail, when the display panel is prepared, the display panel may be inserted into the deposition chamber 170. After the display panel is inserted into the deposition chamber 170, the monomer vaporizing device 100 may operate.

Once the monomer vaporizing device 100 operates, the first opening/closing valve 117a through the fourth opening/closing valve 117d may be opened to cause the first monomer and the second monomer stored in the monomer storage unit 111 to flow. In this case, the first actuator 118a and the second actuator 118b may operate to cause the first monomer and the second monomer from the monomer storage unit 111 to the monomer supply pipe 112 to flow.

In detail, when the first opening/closing valve 117a and the third opening/closing valve 117c are opened and then the first actuator 118a and the second actuator 118b operate, the first monomer and the second monomer of the monomer storage unit 111 may be respectively transferred from the first connection pipe 113 to the branch pipe 114a and the second branch pipe 114b to the first actuator 118a and the second actuator 118b. After the first monomer and the second monomer are respectively introduced into the first actuator 118a and the second actuator 118b, the first opening/closing valve 117a and the third opening/closing valve 117c may be closed.

When the process is completed, the second opening/closing valve 117b and the fourth opening/closing valve 117d may be opened and then the first actuator 118a and the second actuator 118b may operate. In this case, the first monomer and the second monomer may flow to the first branch pipe 114a and the second branch pipe 114b.

The first monomer and the second monomer flowing as described above may gather from the first branch pipe 114a and the second branch pipe 114b to the first connection pipe 113 and then may respectively branch to the first supply pipe 116a and the second supply pipe 116b. In this case, the first supply pipe 116a and the second supply pipe 116b may respectively supply the first monomer and the second monomer to the first vaporizer 120 and the second vaporizer 130.

When certain amounts of first monomer and second monomer are respectively supplied to the first vaporizer 120 and the second vaporizer 130 as described above, the second opening/closing valve 117b and the fourth opening/closing valve 117d may operate to close the first branch pipe 114a and the second branch pipe 114b. Accordingly, after the first monomer and the second monomer are respectively supplied to the first vaporizer 120 and the second vaporizer 130, the second opening/closing valve 117b and the fourth opening/closing valve 117d may prevent the first monomer and the second monomer from flowing backward from the first vaporizer 120 and the second vaporizer 130.

Once the first monomer and the second monomer are supplied as described above, the first monomer and the second monomer may be respectively introduced into the first barrel 121 and the second barrel 131. In this case, the first monomer and the second monomer may be sprayed into the first barrel 121 and the second barrel 131 through ultrasonic nozzles.

When the first monomer and the second monomer are respectively sprayed into the first barrel 121 and the second barrel 131 as described above, the first temperature control unit 122 and the second temperature control unit 132 may operate. In this case, the first temperature control unit 122 and the second temperature control unit 132 may operate simultaneously or sequentially. In particular, the first temperature control unit 122 may first operate, and the second temperature control unit 132 may operate when the control unit 190 determines that the first barrel 121 malfunctions. However, for convenience, the following explanation will be made in detail on the assumption that the first temperature control unit 122 and the second temperature control unit 132 operate sequentially.

In detail, the control unit 190 may increase a temperature in the first barrel 121 by operating the first temperature control unit 122. In this case, the control unit 190 may measure a temperature of the first temperature control unit 122 and may maintain the temperature in the first barrel 121 in a certain range.

When the first temperature control unit 122 operates as described above, the first monomer in the first barrel 121 may be vaporized into gas. In this case, the first temperature measuring sensor unit 181b provided on the first temperature control unit 122 may measure a temperature of the first vaporizer 120 and transmit the temperature to the control unit 190.

In detail, the temperature of the first temperature control unit 122 measured by the first temperature measuring sensor unit 181b may be transmitted to the control unit 190. In this case, a first set temperature range may be preset in the control unit 190.

When the temperature of the first temperature control unit 122 corresponds to the first set temperature range, the control unit 190 may open the first flow pipe 141 by opening the first control valve 161. That is, when the temperature of the first temperature control unit 122 enters the first set temperature range, the control unit 190 may open the first control valve 161. Alternatively, when the temperature of the first temperature control unit 122 remains within the first set temperature range in a third set time, the control unit 190 may open the first control valve 161. In this case, the first monomer of the first vaporizer 120 may move to the deposition chamber 170 and may be deposited on the display panel. In this case, the control unit 190 may close the second control valve 162.

During the process, the first temperature measuring sensor unit 181b may continuously transmit the temperature of the first temperature control unit 122 to the control unit 190. In this case, the control unit 190 may monitor whether the first vaporizer 120 operates within acceptable parameters based on the temperature of the first temperature control unit 122.

When it is determined based on a result of the monitoring that the temperature of the first temperature control unit 122 does not correspond to the first set temperature range, the control unit 190 may direct the alarm unit to alarm the external user that the monomer vaporizing device 100 malfunctions. In particular, when the temperature of the first temperature control unit 122 exceeds the first set temperature range, the control unit 190 may operate the alarm unit to alarm the external user.

Whether the monomer vaporizing device 100 malfunctions may be determined by determining whether the temperature of the first temperature control unit 122 corresponds to the first set temperature range as described above. Alternatively, whether the monomer vaporizing device 100 malfunctions may be determined by determining whether the temperature of the first temperature control unit 122 reaches the first set temperature range for a third set time.

In detail, the control unit 190 may continuously receive the temperature of the first temperature control unit 122 from the first pressure measuring sensor unit 181a. In this case, the control unit may determine whether the temperature of the first temperature control unit 122 remains within the first set temperature range for the third set time, which is preset. In this case, when the temperature of the first temperature control unit 122 does not remain within the first set temperature range for the third set time, the control unit 190 may determine that the monomer vaporizing device 100 malfunctions. In particular, the control unit 190 may determine that the first vaporizer 120 malfunctions when the temperature of the first temperature control unit 122 does not remain within the first set temperature range for the third set time.

Examples of a method of determining whether the first vaporizer 120 malfunctions may include a method of determining whether the temperature exceeds the first set temperature range and a method of determining whether the temperature remains within the first set temperature range for the third set time as described above. For convenience, however, the following explanation will focus on the method of determining whether the temperature exceeds the first set temperature range in order to determine whether the first vaporizer 120 malfunctions.

When the temperature of the first temperature control unit 122 exceeds the first set temperature range, the control unit 190 may close the first flow pipe 141 by closing the first control valve 161.

When the process is completed, the control unit 190 may direct the second temperature control unit 132 to operate. In this case, the control unit 190 may direct the second temperature control unit 132 such that the second monomer of the second barrel 131 is brought to a certain pressure and a certain temperature.

While the second monomer of the second barrel 131 is heated by the second temperature control unit 132, a temperature of the second temperature control unit 132 may be measured by the second temperature measuring sensor unit 182b.

The measured temperature may be transmitted to the control unit 190. In particular, the control unit 190 may control the second control valve 162 based on the measured temperature.

In detail, the temperature of the second temperature control unit 132 measured by the second temperature measuring sensor unit 182b may be transmitted to the control unit 190. The control unit 190 may compare the temperature of the second temperature control unit 132 with a second set temperature range which is preset. In this case, the second set temperature range may be set to be the same as the first set temperature range.

When it is determined that the second set temperature range and the temperature of the second temperature control unit 132 correspond to each other, the control unit 190 may open the second control valve 162 and may supply the second monomer from the second barrel 131 to the deposition chamber 170. In this case, examples of a method of determining whether the temperature of the second temperature control unit 132 corresponds to the second set temperature range, the comparison being made by the control unit 190, may include a method of determining whether the temperature of the second temperature control unit 132 is within the second set temperature range and a method of determining whether the temperature of the second temperature control unit 132 remains within the second set temperature range for a fourth set time. However, for convenience, the following explanation will focus on the method of determining whether the temperature of the second temperature control unit 132 is within the second set temperature range, the comparison being performed by the control unit 190.

The second pressure measuring sensor unit 182a may continuously measure the temperature of the second temperature control unit 132 in a state where the second control valve is opened. The measured temperature of the second temperature control unit 132 may be continuously transmitted to the control unit 190.

The control unit 190 may compare the temperature of the second temperature control unit 132 with the second set temperature range. In this case, when it is determined that the temperature of the second temperature control unit 132 exceeds the second set temperature range, the control unit 190 may alarm the external user by using the alarm unit. Also, the control unit 190 may close the second control valve 162 to close the second flow pipe 142.

In particular, the control unit 190 may close the second control valve 162 and then may direct the monomer vaporizing device 100 to stop operating.

Alternatively, the control unit 190 may determine whether the temperature of the second temperature control unit 132 remains within the second set temperature range for the fourth set time. In particular, when the temperature of the second temperature control unit 132 does not remain within the second set temperature range for the fourth set time, the control unit 190 may determine that the second vaporizer 130 malfunctions and may accordingly activate the alarm unit and close the second control valve 162.

Accordingly, when the first vaporizer 120 malfunctions, the monomer vaporizing device 100 may operate the second vaporizer, thus ensuring that the application of a monomer layer to the display panel proceeds as a continuous process.

Thus, the monomer vaporizing device 100 may prevent a malfunction and, if necessary, rapidly respond to a malfunction that does occur by monitoring the pressures of the first vaporizer 120 and the second vaporizer 130 as the monomer layer is deposited onto the display panel.

According to the embodiments of the present invention, when a first vaporizer malfunctions, a second vaporizer is operated. Accordingly, when a monomer layer is applied to a display panel, the process may be continuously performed.

Also, according to the embodiments of the present invention, a malfunction may be prevented and a fast response to a malfunction may be ensured by determining, based on pressures of the first vaporizer and the second vaporizer as monitored by control unit 190, whether a monomer vaporizing device malfunctions as a monomer layer is deposited.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of controlling a monomer vaporizing device, the method comprising:
supplying a monomer to a first vaporizer and a second vaporizer;
vaporizing the monomer by heating the first vaporizer and the second vaporizer;
measuring a temperature in a first barrel of the first vaporizer while first supplying the monomer vaporized by the first vaporizer to a deposition chamber;
activating an alarm when the measured temperature does not remain within a first set temperature range; and
blocking the exit of the monomer from the first vaporizer when the measured temperature in the first barrel of the first vaporizer does not remain within the first set temperature range, and, if the exit of the monomer from the first vaporizer is blocked, supplying the monomer vaporized by the second vaporizer to the deposition chamber.

2. The method of claim 1, further comprising measuring a temperature in a second barrel of the second vaporizer while supplying the monomer vaporized by the second vaporizer to the deposition chamber, the exit of the monomer from the second vaporizer to the deposition chamber being blocked when the temperature in the second barrel of the second vaporizer does not remain within a second set temperature range for a fourth set time.

3. The method of claim 1, further comprising measuring a temperature in a second barrel of the second vaporizer while supplying the monomer vaporized by the second vaporizer to the deposition chamber, the exit of the monomer from the second vaporizer to the deposition chamber being blocked when the temperature in the second barrel of the second vaporizer exceeds a second set temperature range which is preset.

* * * * *